(12) United States Patent
Audette et al.

(10) Patent No.: US 7,387,911 B2
(45) Date of Patent: Jun. 17, 2008

(54) APPLICATION OF A THERMALLY CONDUCTIVE THIN FILM TO A WAFER BACKSIDE PRIOR TO DICING TO PREVENT CHIPPING AND CRACKING

(75) Inventors: David M Audette, Colchester, VT (US); Steven R. Codding, Underhill Center, VT (US); Timothy C. Krywanczyk, Essex Junction, VT (US); Brian J. Thibault, Hinesburg, VT (US); Matthew R. Whalen, Chelsea, VT (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 10/990,778

(22) Filed: Nov. 16, 2004

(65) Prior Publication Data

US 2006/0105547 A1    May 18, 2006

(51) Int. Cl.
*H01L 21/50* (2006.01)
*H01L 21/48* (2006.01)
*H01L 21/44* (2006.01)
*H01L 21/46* (2006.01)
*H01L 23/544* (2006.01)
*H01L 21/768* (2006.01)
*H01L 21/78* (2006.01)

(52) U.S. Cl. .................. 438/114; 438/110; 438/113; 438/458; 257/620; 257/E21.596; 257/E21.599

(58) Field of Classification Search ............... 438/114, 438/110, 113, 458; 257/620, E21.596, E21.599
See application file for complete search history.

(56) References Cited

U.S. PATENT DOCUMENTS

| 6,023,094 | A | 2/2000 | Kao et al. | |
|---|---|---|---|---|
| 6,709,953 | B2 | 3/2004 | Vasquez et al. | |
| 6,734,532 | B2 | 5/2004 | Koduri et al. | |
| 6,790,709 | B2 * | 9/2004 | Dias et al. | 438/122 |
| 6,812,548 | B2 * | 11/2004 | Dias et al. | 257/620 |
| 6,916,688 | B1 * | 7/2005 | Kelkar et al. | 438/122 |
| 2002/0173077 | A1 * | 11/2002 | Ho et al. | 438/113 |
| 2003/0143818 | A1 | 7/2003 | Vasquez et al. | |

* cited by examiner

*Primary Examiner*—Luan Thai
(74) *Attorney, Agent, or Firm*—Scully, Scott, Murphy & Presser, PC; William H. Steinberg

(57) ABSTRACT

A thermally conductive protective film or layer is applied to the backside surface of a semiconductor wafer prior to a subsequent dicing operation performed on the wafer to singulate the wafer into diced semiconductor chips, during which the thin thermally conductive film minimizes and prevents chipping and cracking damage to the wafer and diced chips. During subsequent electrical operation of a diced chip, the thin thermally conductive film functions as a thermal conductor to dissipate and conduct away to a heat sink any heat generated during operation of the chip.

14 Claims, No Drawings

APPLICATION OF A THERMALLY CONDUCTIVE THIN FILM TO A WAFER BACKSIDE PRIOR TO DICING TO PREVENT CHIPPING AND CRACKING

BACKGROUND OF THE INVENTION

1. Field of the Invention

The present invention relates generally to the processing, fabrication and usage of semiconductor chips and wafers. More specifically, the present invention applies a thermally conductive protective film or layer to the backside surface of a semiconductor wafer prior to a subsequent dicing operation performed on the wafer to singulate the wafer into diced semiconductor chips, during which the thin thermally conductive film minimizes and prevents chipping and cracking damage to the wafer and diced chips. During subsequent electrical operation of a diced chip, the thin thermally conductive film functions as a thermal conductor to dissipate and conduct away to a heat sink any heat generated during operation of the chip After the fabrication of integrated circuits on a wafer, the wafer is diced by a sawing operation, during which the edges of the chips are subject to damage by chipping or cracking. Pursuant to the present invention, a thin film or layer of a thermally conductive material, such as a metal filled epoxy, is applied to the backside of a silicon wafer prior to a dicing operation. The thin film or layer prevents any chipped or cracked silicon from breaking off dies that are diced from the wafer, and also functions as a thermal conductor to conduct away and dissipate any heat generated during subsequent electrical operation of the chips.

2. Discussion of the Prior Art

As is well known in the semiconductor industry, a chip is a miniaturized electronic circuit that is mass-produced, generally along with a large number of other chips on a fabricated wafer of a semiconductor material such as silicon. The electronic circuits on a chip typically include transistors and other electronic and electrical components. State of the art manufacturing techniques are now capable of generating millions of components on a chip smaller than a fingertip. Each wafer is typically fabricated with a large number of chips, and after fabrication, the wafer is diced or cut to singulate the wafer into separate individual dies having individual chips thereon.

In a typical prior art dicing operation, a semiconductor wafer is supported by a tape applied to the backside of the semiconductor wafer that is opposite to the device or active side of the semiconductor wafer. The backside tape is supported by an outer metal hoop frame, with the wafer being suspended on the backside tape generally in the center of the metal hoop frame. The dicing saw generally can comprise a diamond wheel having a thickness of approximately 70 microns and a V shaped circumferential cutting edge. A full thickness semiconductor wafer may be diced or cut by several successively deeper cuts or passes through the full thickness wafer. The dicing operation is generally performed from the device side of the wafer through to the backside of the wafer because the dicing cutting wheel can cause chipping and cracking damage to the backside (far) surface of the wafer, particularly during the last cutting pass through the backside of the wafer and partially into the backside tape. Accordingly, it is desirable to have any damage caused by the dicing saw to be to the backside of the semiconductor wafer rather than to the device or active side of the semiconductor wafer.

The thickness of the wafer is also a factor in the amount of damage caused to the wafer during the dicing operation, and each pass of the dicing cutting wheel creates cracks and chips in the wafer. The wafer is diced and singulated into a plurality of individual dies still supported on the backside tape, and the good dies are then identified and are picked off and separated from the backside tape by a picking tool, frequently operated with the assistance of a vacuum for removal of the separated good dies. Speed is an important consideration in performing the dicing operation, the picking operation, and any subsequent packaging and shipping operations. The good dies are frequently packaged in a slotted carrier container, and the picking and shipping operations can also cause additional cracking and chipping of the silicon of the separated good dies.

The chipping and cracking of silicon at the backside surface of semiconductor chips has been a continuing, ongoing problem during dicing operations performed on full thickness semiconductor wafers. Possible solutions to alleviate the chipping and cracking problems have included the use of different dicing saws, different dicing conditions, backside processes and the application of dicing tapes, and the solutions have helped alleviate the problems to some extent. However, the solutions have not totally alleviated the chipping and cracking problems that occur during dicing, picking and shipping operations performed on the chips.

The prior art has disclosed the application of a thin film to a wafer backside prior to a dicing operation to minimize and prevent chipping and cracking damage to the wafer and chips during the dicing operation. However, the prior art has not appreciated that the same thin film can also function as a thermal conductor to conduct away and dissipate any heat generated by the chip during subsequent electrical operation of the chip.

SUMMARY OF THE INVENTION

In view of the aforementioned problems, the present invention applies a thin thermally conductive film to a wafer backside prior to a dicing operation to minimize and prevent chipping and cracking damage to the wafer and chips during the dicing operation and also to function as a thermal conductor to conduct away and dissipate any heat generated by the chip during subsequent electrical operation of the chip.

DETAILED DESCRIPTION OF THE INVENTION

Pursuant to the present invention, a thin film or layer of a thermally conductive material, such as a metal filled epoxy, is applied to the backside of a silicon wafer prior to a dicing operation performed on the wafer.

A first function of the thin film or layer of thermally conductive material is to prevent chipping and cracking of the silicon during the dicing operation, and to prevent any chipped or cracked silicon from breaking off dies that are diced from the wafer. The thin film or layer of thermally conductive material is resistant to chipping, cracking, crumbling and breaking, and advantageously has a hardness equal to and preferably greater than the silicon material it is protecting. The thin film or layer provides a resistance to chipping and cracking of the silicon, and also prevents any chipped or cracked silicon from breaking off and separating from the chip during the dicing operation and also during subsequent picking, packaging and shipping operations.

A second function of the thin film or layer of material is to serve as a thermal conductor to conduct away and dissipate to a heat sink any heat generated by the chip during subsequent electrical operation of the chip. The thin film is preferably a good thermal conductor, generally having a coefficient of thermal conductivity greater than 10 W/mK (Watts/meter Kelvin). A high coefficient of thermal conductivity is desirable as during normal electrical operations, each chip generates a fair amount of heat or thermal energy, and an important function of the thin thermally conductive film is to act as a thermal conductor to conduct and dissipate the generated heat to a heat sink.

The thin film can also be electrically conductive, for example to allow the application of a given electrical potential bias to the chip from the backside/substrate side of the chip.

The thin film or layer can generally have a thickness of a fraction (e.g. 0.5) of a micron up to approximately 100 microns, with the thickness of the film being a consideration of the thermal conductivity functions of the film.

The thermally conductive film or layer is preferably applied to the backside of the wafers using any well known application technique.

The thermally conductive film or layer can be applied to the backside of the wafers shortly after the application of a polyimide material to the front side of the wafers. The wafers are then cured and subjected to additional processing operations. The backsides of the wafers are coated with the protective thermally conductive epoxy before the wafers reach the dicing step. The thermally conductive epoxy prevents any cracked or chipped silicon from breaking off the chips during subsequent dicing, picking and shipping operations.

The particular type of thermally conductive material is dependent upon the particular type of wafer, and its packaging requirements, etc. The applied layer or film of thermally conductive material should be compatible with the backside of the chip and permanently adhere to the chip. The thermally conductive film or layer adheres to the wafer and to any cracked or chipped silicon to prevent it from breaking off the chip during subsequent dicing, picking and shipping operations performed on the chip.

One suitable class of thermally conductive materials is an epoxy material carrying a thermally conductive metal in suspension in the epoxy material, with suitable thermally conductive metals being silver, gold, copper, iron, etc.

One example of a suitable thermally conductive epoxy material is CW2400, available from JB Weld, which is an iron filled epoxy. Another example of an epoxy that has good thermal/electrical properties is silver epoxy, available from M. E. Taylor engineering, having a heat conductivity=19.03 W/mK (Watts/meter Kelvin), and an electrical conductivity=0.001 ohm*cm (volume resistance).

Microphotographs of cross sections of semiconductor wafers having a thermally conductive epoxy coating applied to the backside of the wafer prior to a dicing operation, and also of wafers not having a thermally conductive epoxy coating applied to the backside of the wafer prior to the dicing operation, have illustrated how the thermally conductive epoxy coating alleviates and prevents severe problems with chipping and cracking of the silicon during subsequent dicing operations performed on the wafers.

While several embodiments and variations of the present invention are described in detail herein, it should be apparent that the disclosures and teachings of the present invention will suggest many alternative designs to those skilled in the art.

What is claimed is:

1. A method of processing a semiconductor wafer comprising:
    fabricating the semiconductor wafer;
    applying a thin film of a thermally conductive material to the backside of the semiconductor wafer; and
    performing a dicing operation on the semiconductor wafer with the thin film of thermally conductive material on the backside of the semiconductor wafer, wherein the thin film of thermally conductive material functions as a thermal conductor to conduct away and dissipate any heat generated by a diced chip during subsequent electrical operation of the diced chip and also prevents chipping and cracking of the semiconductor wafer during the dicing operation, and wherein the thin film of thermally conductive material also has a hardness at least equal to a hardness of the semiconductor wafer.

2. The method of claim 1, wherein the thin film of thermally conductive material has a coefficient of thermal conductivity greater than 10 W/mK (Watts/meter Kelvin).

3. The method of claim 1, wherein the thin film of thermally conductive material is also electrically conductive to allow the application of a given electrical potential bias to the backside of the chip.

4. The method of claim 1, wherein the applying step applies the thin film of thermally conductive material with a thickness in the range of a fraction of a micron up to approximately 100 microns.

5. The method of claim 1, wherein the applying step applies the thin film of thermally conductive material to the backside of the wafer after the application of a polyimide material to the front side of the wafer.

6. The method of claim 1, wherein the thin film of thermally conductive material comprises an epoxy material having a thermally conductive metal in suspension in the epoxy material.

7. The method of claim 5, wherein the thermally conductive metal comprises a metal selected from the group consisting of silver, gold, copper and iron.

8. A method of processing and using a semiconductor wafer comprising:
    fabricating the semiconductor wafer;
    applying a thin film of a thermally conductive material to the backside of the semiconductor wafer;
    performing a dicing operation on the semiconductor wafer with the thin film of thermally conductive material on the backside of the semiconductor wafer, where the thin film of thermally conductive material prevents chipping and cracking of the semiconductor wafer during the dicing operation; and
    using the thin film of thermally conductive material as a thermal conductor to conduct away and dissipate heat generated by a diced chip during subsequent electrical operation of the diced chip, wherein the thin film of thermally conductive material also has a hardness at least equal to a hardness of the semiconductor wafer.

9. The method of claim 8, wherein the thin film of thermally conductive material has a coefficient of thermal conductivity greater than 10 W/mK (Watts/meter Kelvin).

10. The method of claim 8, wherein the thin film of thermally conductive material is also electrically conductive to allow the application of a given electrical potential bias to the backside of the chip.

11. The method of claim 8, wherein the applying step applies the thin film of thermally conductive material with a thickness in the range of a fraction of a micron up to approximately 10 microns.

12. The method of claim 8, wherein the applying step applies the thin film of thermally conductive material to the backside of the wafer after the application of a polyimide material to the front side of the wafer.

13. The method of claim 8, wherein the thin film of thermally conductive material comprises an epoxy material having a thermally conductive metal in suspension in the epoxy material.

14. The method of claim 13, wherein the thermally conductive metal comprises a metal selected from the group consisting of silver, gold, copper and iron.

* * * * *